(12) United States Patent
Blake et al.

(10) Patent No.: US 7,715,170 B2
(45) Date of Patent: May 11, 2010

(54) ELECTROSTATIC CHUCK WITH SEPARATED ELECTRODES

(75) Inventors: Julian G. Blake, Gloucester, MA (US); Dale K. Stone, Lynnfield, MA (US); Lyudmila Stone, Lynnfield, MA (US); David Suuronen, Newburyport, MA (US)

(73) Assignee: Varian Semiconductor Equipment Associates, Inc., Glouster, MA (US)

( * ) Notice: Subject to any disclaimer, the term of this patent is extended or adjusted under 35 U.S.C. 154(b) by 554 days.

(21) Appl. No.: 11/690,950

(22) Filed: Mar. 26, 2007

(65) Prior Publication Data

US 2008/0239614 A1  Oct. 2, 2008

(51) Int. Cl.
H01L 21/683 (2006.01)
H01T 23/00 (2006.01)
(52) U.S. Cl. ...................................... 361/234
(58) Field of Classification Search ................. 361/234
See application file for complete search history.

(56) References Cited

U.S. PATENT DOCUMENTS

| 5,532,903 | A | | 7/1996 | Kendall |
| 5,656,093 | A | * | 8/1997 | Burkhart et al. ............. 118/728 |
| 5,764,471 | A | | 6/1998 | Burkhart |
| 6,388,861 | B1 | | 5/2002 | Frutiger |
| 2004/0040665 | A1 | | 3/2004 | Mizuno et al. |
| 2005/0183669 | A1 | | 8/2005 | Parkhe et al. |
| 2006/0158823 | A1 | | 7/2006 | Mizuno et al. |

FOREIGN PATENT DOCUMENTS

WO  WO2008020955  2/2008

* cited by examiner

*Primary Examiner*—Jared J Fureman
*Assistant Examiner*—Dharti H Patel

(57) ABSTRACT

Electrostatic clamping devices and methods for reducing contamination to a workpiece coupled to an electrostatic clamping device are disclosed. According to an embodiment an electrostatic clamping device for coupling a workpiece comprises: an embossment portion on a surface of a body to contact the workpiece; and at least two electrodes within the body; wherein the two electrodes are separated by a separation portion below the embossment portion.

17 Claims, 3 Drawing Sheets

US 7,715,170 B2

ELECTROSTATIC CHUCK WITH SEPARATED ELECTRODES

BACKGROUND OF THE DISCLOSURE

1. Technical Field

The present disclosure relates generally to integrated circuit processing, and more particularly, to electrostatic clamping devices for coupling a workpiece and methods for reducing workpiece contamination in the coupling.

2. Related Art

Electrostatic chucks are widely used to support/hold wafers for processing, e.g., ion implantation, in integrated circuit (IC) processing systems. An electrostatic chuck includes a chuck body having at least one electrode within the chuck body. When a voltage is applied to the electrodes, an electrical field is created adjacent to a surface of the chuck body such that a wafer can be clamped to the surface to be retained. The surface may include embossment portions, referred to as mesas, to support the wafer and to reduce physical contact with the wafer.

In the clamping, the backside of the clamped wafer has a physical contact with the chuck surface, e.g., mesas, of the electrostatic chuck. This contact may result an particles that contaminate the wafer and may contaminate the processing chambers of the wafer, which are generally referred to as backside particles. The contaminating backside particles usually damage devices manufactured from the wafer and cause yield losses.

SUMMARY OF THE INVENTION

A first aspect of the invention is directed to an electrostatic clamping device for coupling a workpiece, the electrostatic clamping device comprising: an embossment portion on a surface of a body to contact the workpiece; and at least two electrodes within the body; wherein the two electrodes are separated by a separation portion below the embossment portion.

A second aspect of the invention is directed to an electrostatic clamping device for coupling a workpiece, the electrostatic clamping device comprising: an embossment portion on a surface of a body to contact the workpiece: and at least two electrodes within the body, wherein the two electrodes are configured such that when a voltage is applied to the two electrodes, an electrical field adjacent to the embossment portion created by the two electrodes is substantially parallel to the surface of the body.

A third aspect of the invention is directed to a method for reducing contamination to a workpiece supported by an electrostatic chuck, the method comprising creating an electrical field substantially parallel to a surface of the electrostatic chuck adjacent to an embossment portion of the electrostatic chuck.

The foregoing and other features of the invention will be apparent from the following more particular description of embodiments of the invention.

BRIEF DESCRIPTION OF THE DRAWINGS

The embodiments will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the invention. In the drawings, like numbering represents like elements among the drawings.

DETAILED DESCRIPTION

The current disclosure is based on the finding that backside particles are located mainly around the positions that the wafer contacts the mesas of the electrostatic chuck. The current disclosure reduces backside particle contamination to a workpiece by creating an electrical field substantially parallel to a surface of the chuck body adjacent to the embossment portions on the surface. Any method may be used to create such a surface parallel electrical field, and all are included. For example, FIG. 1 shows a planar view of an electrostatic clamping device (clamping device) 10 according to an embodiment of the disclosure, FIG. 2 shows a cross-sectional view of electrostatic clamping device 10 of FIG. 1.

Figure 1:
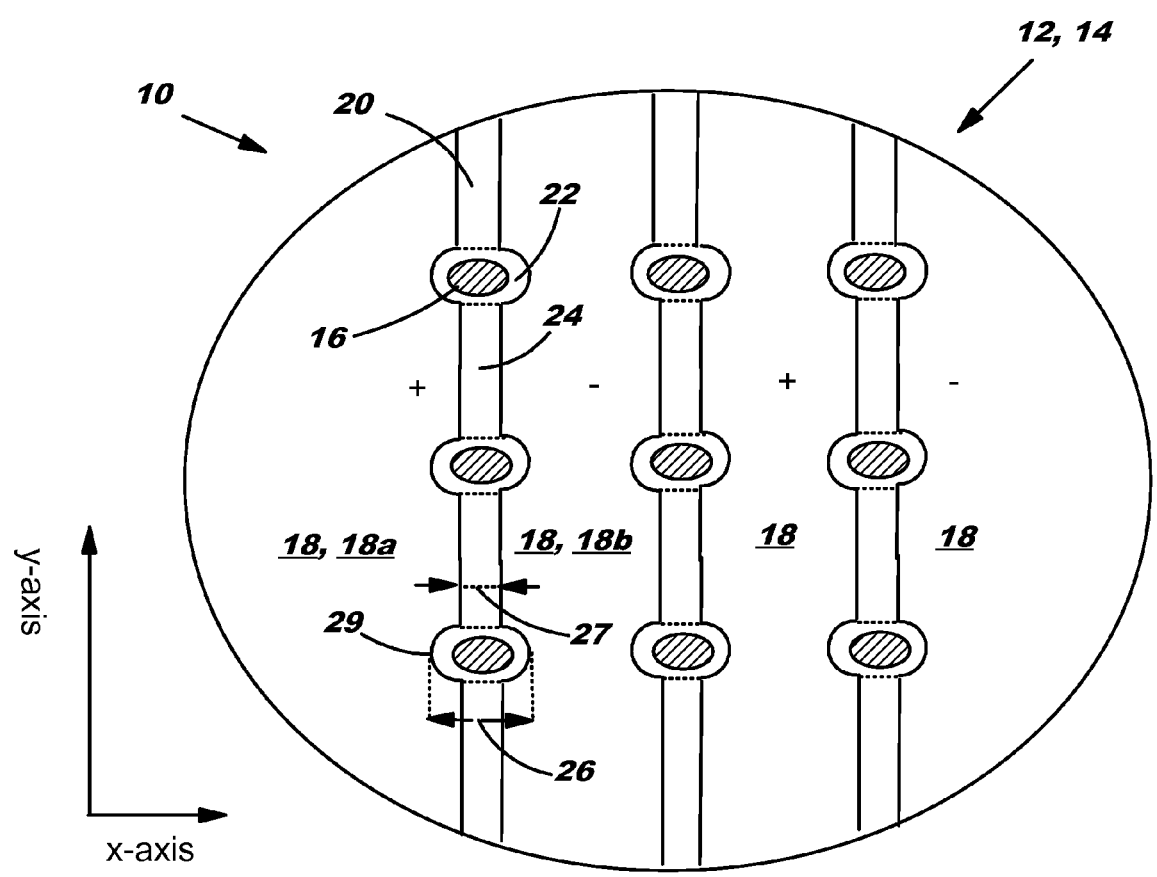
FIG. 1 shows a schematic planar view of an electrostatic clamping device according to an embodiment of the disclosure.
Figure 2:
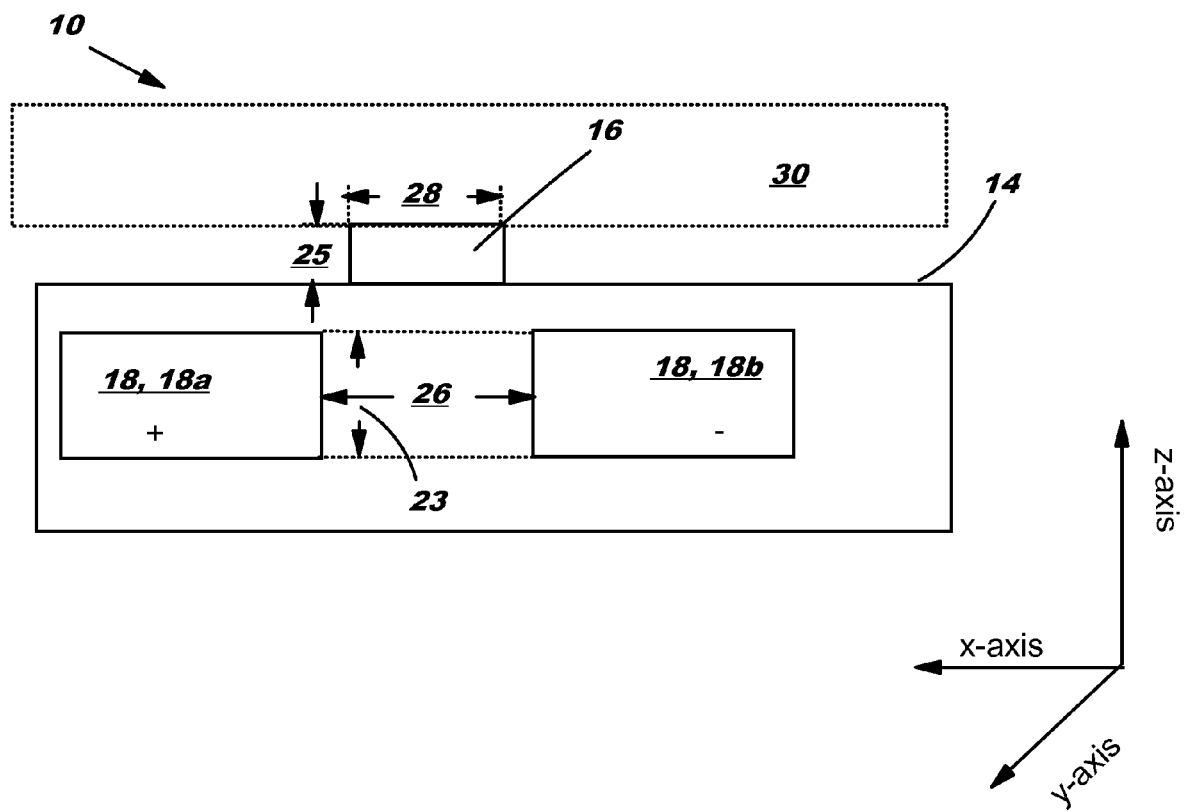
FIG. 2 shows a schematic cross-sectional view of the electrostatic clamping device of FIG. 1 according to an embodiment of the disclosure.

Referring to FIGS. 1-2, clamping device 10 includes a body 12 having a body surface 14. Embossment portions (embossment) 16, e.g., mesas, are on surface 14. Embossments 16 may contact workpiece 30 (shown in phantom in FIG. 2) coupled to clamping device 10. At least two electrodes 18 are within body 12 in a layer under surface 14. According to an embodiment, the at least two electrodes, e.g., 18a and 18b, are separated by a separation portion 20, e.g., a gap, below embossment 16. Part of separation portion 20 is directly below embossment 16. As such, as shown in FIG. 2, there is no electrode directly below embossment 16.

According to an embodiment, as shown in FIG. 1, separation portion 20 includes at least one first portion 22 directly below an embossment 16 and at least one second portion 24 extending from first portion 22 along the respective two electrodes (i.e., the two electrodes 18 separated by separation portion 20) 18, e.g., 18a and 18b. That is, second portion 24 is below, but not directly below embossment(s) 16.

According to an embodiment, as shown in FIG. 1, first portion 22 covers a planar area that encloses a planar area covered by embossment 16. That is, if embossment 16 is projected onto the same plane as separation portion 20, the planar area of embossment 16 will be totally within the planar area of first portion 22. As such, as shown in FIG. 2, a distance 26 between electrodes 18a and 18b, in x-axis, at a location substantially directly below embossment 16 is larger than a planar dimension 28 of the embossment in the same x-axis. Preferably, the planar area of first portion 22 is only slightly larger, i.e., less than 10 percent larger, than the planar area of embossment 16.

According to an embodiment, first portion 22 has a planar shape substantially similar to, but bigger than, a planar shape of embossment 16. FIG. 1 shows that embossment 16 and first portion 22 both have an oval/circular planar shape. However, the current invention is not limited to any specific shape of embossment 16 and/or first portion 22. First portion 22 may have a height, i.e., in the z-axis, approximately twice of a height 25, in the same z-axis, of embossment 16. However, this is not necessary and other height 23 of first portion 22 relative to that of embossment 16 are also possible and included in the invention. In the current description, a "height" refers to a dimension in the z-axis that is perpendicular to surface 14 of electrostatic chuck 10.

According to an embodiment, as shown in FIG. 1 second portion 24 s narrower than first portion 22 in the x-axis along which electrodes 18a and 18b are separated. Correspondingly, at least one of the two electrodes, 18a and 18b, includes a recess portion 29 that is substantially directly below respective embossment 16. As such, distance 26 between electrodes 18a and 18b at a location substantially directly below embossment 16 is larger than a distance 27 between electrodes 18a and 18b at another location, i.e., a location other than recess portion 29.

Figure 3:
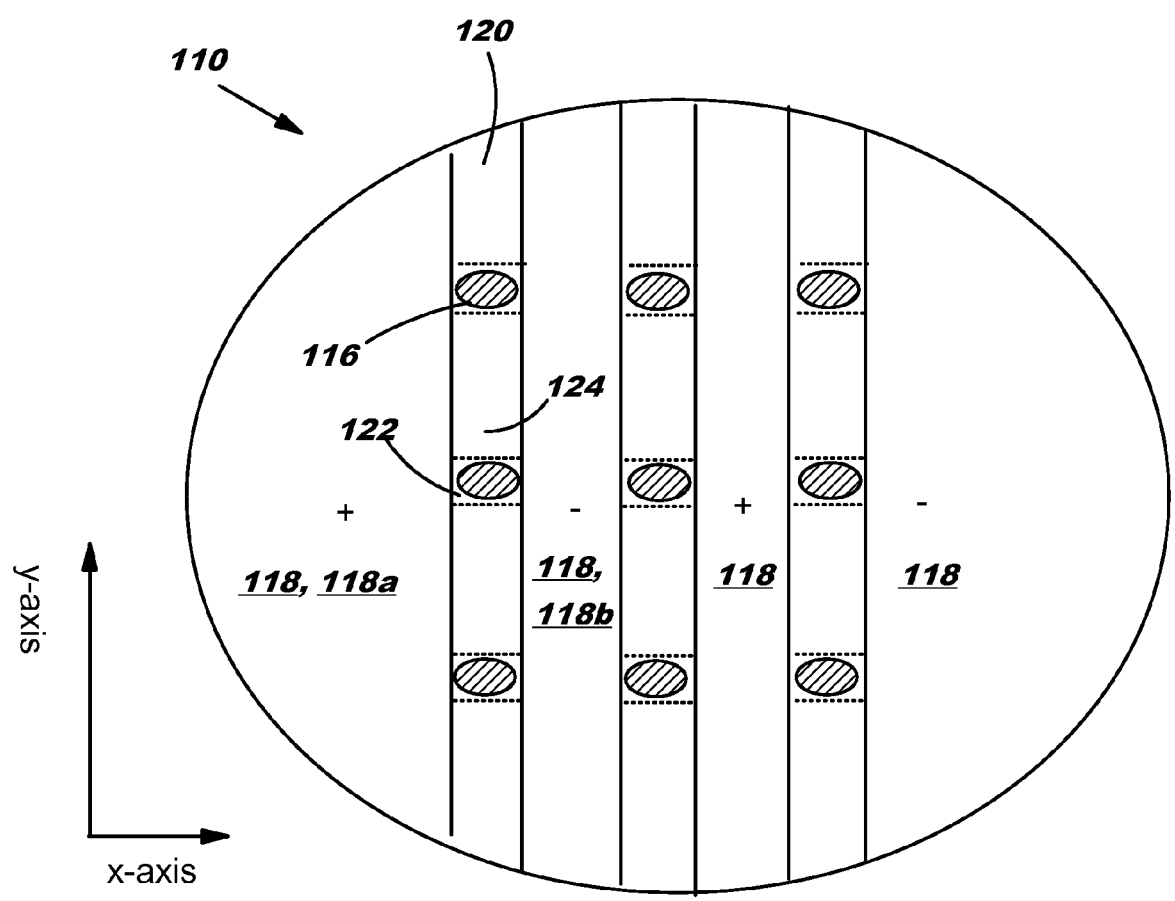
FIG. 3 shows a schematic planar view of an electrostatic clamping device according to an alternative embodiment of the disclosure.

According to an alternative embodiment, as shown in FIG. 3, electrostatic clamping device 110 includes a second portion 124 that is substantially as wide as first portion 122 in the x-axis along which electrodes 118a and 118b are separated.

In the case that multiple embossments 16 are positioned in a line, as shown in, e.g., FIG. 1, each first portion 22 directly below the multiple embossments 16 shares a second portion 24 with an immediately adjacent first portion 22. As such, separation portion 20 includes multiple first portions 22 and multiple second portions 24 connected in a line along respective electrodes 18a, 18b.

As shown in FIGS. 1 and 3, according to an embodiment, around a first portion 22/122, the respective two immediately adjacent electrodes, e.g., 18a/118a and 18b/118b, are substantially parallel to one another. The inclusion of recess portions 29 does not affect the parallel position between electrodes 18a and 18b. FIGS. 1 and 3 show that electrodes 18a/118a and 18b/118b are substantially parallel to one another throughout the y-axis, which is a specific embodiment. The scope of the invention is not limited by the configuration shown in FIGS. 1 and 3.

According to an embodiment, two immediately adjacent electrodes 18 that are separated by separation portion 20, e g, 18a and 18b, are connected to different polarities (illustrated by "+" and "−" in FIGS. 1 and 3) of a voltage source (not shown). As a consequence, when a clamping voltage is applied to electrodes 18a and 18b, an electrical field adjacent to embossment 16 will be created, which is substantially parallel to surface 14 of body 12. Any type of clamping voltage may be used, and all are included in the invention. For example, the clamping voltage may be one of a direct current (DC) and an alternating current (AC). Preferably, according to an embodiment, a bipolar square wave voltage having a peak-to-peak amplitude of at least 1000 volts and a frequency in the range of approximately 30 Hz to approximately 300 Hz may be used as the clamping voltage. As such, the "+" and "−" used in FIGS. 1 and 3 do not limit any electrodes 18 to a specific polarity, but only indicate that adjacent electrodes 18, e g., 18a and 18b, are connected to different polarities of the clamping voltage.

The foregoing description of various aspects of the disclosure has been presented for purposes of illustration and descriptions. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An electrostatic clamping device for coupling a workpiece, the electrostatic clamping device comprising:
    an embossment portion on a surface of a body to contact the workpiece; and
    at least two electrodes within the body;
    wherein the at least two electrodes are separated by a separation portion below the embossment portion, wherein the separation portion includes a first portion substantially directly below the embossment portion and a second portion extending from the first portion along the at least two electrodes and wherein the second portion is narrower than the first portion in an axis along which the at least two electrodes are separated.

2. The electrostatic clamping device of claim 1, wherein the first portion covers a planar area that encloses a planar area covered by the embossment portion.

3. The electrostatic clamping device of claim 1, wherein the first portion has a planar shape substantially similar to and bigger than a planar shape of the embossment portion.

4. The electrostatic clamping device of claim 1, wherein the first portion has a height approximately twice of a height of the embossment portion.

5. The electrostatic clamping device of claim 1, further comprising multiple embossment portions in a line, wherein each first portion substantially directly below the multiple embossment portions shares a second portion with an immediately adjacent first portion.

6. The electrostatic clamping device of claim 1, wherein the at least two electrodes are substantially parallel to one another adjacent to the first portion of the separation portion.

7. The electrostatic clamping device of claim 1, wherein, when a voltage is applied to the two electrodes, an electrical field adjacent the embossment portion is substantially parallel to the surface of the body.

8. The electrostatic clamping device of claim 7, wherein the voltage is one of a direct current (DC) or an alternating current (AC).

9. The electrostatic clamping device of claim 1, wherein the separation portion includes a gap in the body.

10. An electrostatic clamping device for coupling a workpiece, the electrostatic clamping device comprising:
    an embossment portion on a surface of a body to contact the workpiece; and
    at least two electrodes within the body;
    wherein the at least two electrodes are configured such that when a voltage is applied to the at least two electrodes, an electrical field adjacent to the embossment portion created by the at least two electrodes is substantially parallel to the surface of the body; and
    wherein the two electrodes are separated by a separation portion having a first portion substantially directly below the embossment portion and a second portion extending from the first portion along the at least two electrodes and wherein the second portion is narrower than the first portion in an axis along which the at least two electrodes are separated.

11. The electrostatic clamping device of claim 10, wherein the two electrodes are substantially parallel to one another around a location substantially directly below the embossment portion.

12. The electrostatic clamping device of claim 10, wherein a distance between the at least two electrodes at a location substantially directly below the embossment portion is larger than a planar dimension of the embossment in a same axis.

13. The electrostatic clamping device of claim 12, wherein at least one of the at least two electrodes includes a recess portion substantially directly below the embossment portion such that the distance between the two electrodes at the location substantially directly below the embossment portion is larger than a distance between the at least two electrodes at another location.

14. The electrostatic clamping device of claim 10, wherein the at least two electrodes are separated by a gap in the body.

15. A method for reducing contamination to a workpiece supported by an electrostatic chuck, the method comprising:
creating an electrical field substantially parallel to a surface of the electrostatic chuck adjacent to an embossment portion on a surface of the electrostatic chuck, wherein the electrical field is created by applying a voltage to two electrodes separated by a separation portion, the separation portion covering a planar area bigger than the embossment at a first location substantially directly below the embossment portion and covering a planar area narrower than the first location at second location between the two electrodes.

16. The method of claim 15, wherein the voltage is one of a direct current (DC) or an alternating current (AC).

17. The method of claim 15, wherein the separation portion is a gap with a height approximately twice of a height of the embossment portion.

* * * * *